United States Patent
Burton

(10) Patent No.: US 6,853,968 B2
(45) Date of Patent: Feb. 8, 2005

(54) SIMULATION OF DATA PROCESSING APPARATUS

(75) Inventor: John Mark Burton, Cambridge (GB)

(73) Assignee: Arm Limited, Cambridge (GB)

( * ) Notice: Subject to any disclaimer, the term of this patent is extended or adjusted under 35 U.S.C. 154(b) by 973 days.

(21) Appl. No.: 09/739,785

(22) Filed: Dec. 20, 2000

(65) Prior Publication Data

US 2001/0010034 A1 Jul. 26, 2001

(30) Foreign Application Priority Data

Jan. 20, 2000 (GB) .............................................. 0001328
Oct. 19, 2000 (GB) .............................................. 0025696

(51) Int. Cl.[7] .............................................. G06F 17/50
(52) U.S. Cl. .............................. 703/17; 703/19; 703/22
(58) Field of Search .......................... 703/17, 19, 22; 707/104.1

(56) References Cited

U.S. PATENT DOCUMENTS

| | | | | |
|---|---|---|---|---|
| 4,763,288 A | * | 8/1988 | Deering et al. | ................ 703/19 |
| 4,918,594 A | * | 4/1990 | Onizuka | ....................... 703/15 |
| 5,412,799 A | * | 5/1995 | Papadopoulos | ............... 703/22 |
| 5,764,951 A | | 6/1998 | Ly et al. | |
| 6,473,772 B1 | * | 10/2002 | Barrett et al. | ............. 707/104.1 |

FOREIGN PATENT DOCUMENTS

| | | |
|---|---|---|
| GB | 2 262 636 | 6/1993 |
| GB | 2 279 785 A | 1/1995 |
| JP | 6-4511 | 1/1994 |
| JP | 8-44773 | 2/1996 |

* cited by examiner

*Primary Examiner*—Albert W. Paladini
(74) *Attorney, Agent, or Firm*—Nixon & Vanderhye P.C.

(57) ABSTRACT

A software simulation technique for pipelined hardware is provided in which the hardware is modelled as a plurality of pipelined circuit element models that each respectively read their input data values from a first data storage area A and write their output data values to a second data storage area B. At the end of each simulated clock signal cycle, the first data storage area A and the second data storage area B are swapped to effectively replicate the behavior of the passing of signal values between pipelined stages in a hardware pipeline.

16 Claims, 8 Drawing Sheets

All stages must execute before multistage combinatorial logic

SIMULATION OF DATA PROCESSING APPARATUS

BACKGROUND OF THE INVENTION

1. Field of the Invention

This invention relates to the simulation of data processing apparatus. More particularly, this invention relates to the simulation of data processing apparatus including pipelined circuit elements.

2. Description of the Prior Art

It is known to provide software simulations of data processing hardware. These simulations are useful for many reasons, such as the ability to develop and test software or connected hardware for a new piece of data processing apparatus before the physical form of that data processing apparatus is available.

One approach to providing software simulating a data processing apparatus is to provide a model that seeks to represent all the signal changes within the real data processing apparatus at a circuit component level. The approach can take account of propagation delays and the like produce a highly accurate representation of the response of the real system. Whilst these systems can produce highly accurate results, the large number of signal values that need to be tracked throughout a circuit that may contain hundreds of thousands of transistors is very large and accordingly the speed of operation of such simulators is disadvantageously slow.

An alternative approach to software simulation is to take a high level view of what will be the overall response of the data processing apparatus to a given set of inputs and its existing state. With such an approach the hardware being modelled needs to be extremely well understood so that the high level abstract representation can be accurate. As data processing apparatus becomes increasingly complex, this approach is increasingly difficult. One particular example of such a difficulty is dealing with pipelined data processing apparatus in which the response to a given set of inputs may not occur for several cycles and will be in a manner that is highly dependent upon both preceding and succeeding inputs.

It is desirable to be able to provide simulation of data processing apparatus that can operate rapidly and accurately whilst simplifying the way in which the model can be created.

SUMMARY OF THE INVENTION

Viewed from one aspect the present invention provides a method of simulating operation of data processing apparatus including a plurality of pipelined circuit elements driven by a common clock signal, said method using a plurality of pipelined circuit element models linked by one deep message queues and a set of data storage areas and comprising the steps of:

(i) within a first data storage area storing input data values representing respective input signals passed to each pipelined circuit element at commencement of a simulated common clock signal cycle of said common clock signal;

(ii) during simulation of said simulated common clock signal cycle reading said input data values for each pipelined circuit element from said first data storage area and using a pipelined circuit element model for each pipelined circuit element to generate output data values representing output signals generated by said pipelined circuit element by termination of said simulated common clock signal cycle;

(iii) within a second data storage area storing said output data values; and (iv) changing said second data storage area to serve as said first data storage area such that said stored output data values may serve as input data values during a following simulated clock signal cycle and changing to use a different storage area as said second storage area.

The invention seeks to provide software simulations of pipelined hardware (such as microprocessors) which are both efficient and quick to construct. The resulting software model can directly represent the hardware that it is intended to simulate and can be organised in a way such that the signals, logic and latches of the real hardware are clearly identifiable and understandable within the software model. To achieve these aims the software model is based upon a message passing system with a queue depth of one that may be used to simulate pipelined hardware.

The pipelined circuit elements within the hardware being simulated may be represented by pipelined circuit element models. A first data storage area stores input values for the various pipelined circuit element models and a second data storage area provides storage for output data values. When a given clock cycle has been simulated by each model reading its inputs and writing its outputs, then the roles of the first and second data storage areas may be swapped to provide a highly efficient way of passing data values between the pipelined stages. The real hardware circuit is effectively broken down into natural units representing pipeline stages that can be readily modelled and understood in software. It will be appreciated that the pipeline circuit element models may or may not correspond exactly to the pipeline circuit elements themselves. The passing of data values between pipeline stages and accordingly the associated timing is taken care of by the structure of the model, by which the data storage areas correspond to the physical latches in the hardware, without a disadvantageous degree of analysis of the overall operation of the system and the inter-relation of the various elements being necessary.

The set of data storage areas could have any number of elements greater than two providing the area serving to store outputs for the previous cycle can be switched to provide inputs for the present cycle and an area can be provided to write the outputs for the present cycle without overwriting any other data needed for the present cycle.

The memory requirements of the system can be reduced when the set of data storage areas has two elements and said first data storage area and said second data storage area swap roles such that newly generated output data values may overwrite input data values for a preceding simulated common clock signal cycle.

Whilst it is desirable that the input data values and the output data values represent signal values passed via latches between adjacent serially arranged pipeline circuit elements, this is not necessarily the case for all parts of the model. In particular, it is desirable that the model can include portions that correspond to non-pipelined circuit elements (e.g. logic blocks, such as combinatorial logic, that take their input from one than one pipeline stage). These non-pipelined circuit elements may be integrated into the overall structure of the model by arranging that they write their output data values to the second data storage area.

It is possible for the input data values to non-pipelined circuit elements to be input data values taken from the first data storage area or alternatively the input data values may be taken directly from other portions of the model. In either case it is desirable that the non-pipelined circuit elements do not seek to execute and evaluate their output data values until all of the input data values to which they are responsive have been evaluated for that cycle. The pipelined circuit element models may have various forms. Particularly quick and efficient models are software models that map input data values to output data values. Additional sophistication can be provided by the feedback of state variables within a model itself.

The technique of the present invention may also be used to model data processing apparatus including multiple clock domains by arranging that each plurality of pipelined circuit elements is separately clocked in the simulation.

Whilst the technique of the invention may be applied to a wide variety of sorts of data processing apparatus, it is particularly well suited to the modelling of a pipelined processor, and in such a case the model may be arranged such that each processor pipeline stage corresponds to a pipeline circuit element model.

It will be appreciated that the simulation technique of the invention will normally be performed on a general purpose computer in which the first data storage area and the second data storage area correspond to different regions within a common memory of the general purpose computer.

Viewed from another aspect the present invention provides apparatus for simulating operation of data processing apparatus including a plurality of pipelined circuit elements driven by a common clock signal, said apparatus using a plurality of pipelined circuit element models linked by one deep message queues and comprising:
(i) a first data storage area for storing input data values representing respective input signals passed to each pipelined circuit element at commencement of a simulated common clock signal cycle of said common clock signal;
(ii) a pipelined circuit element model for each pipelined circuit element operating during simulation of said simulated common clock signal cycle to read said input data values for each pipelined circuit element from said first data storage area and to use said input data values to generate output data values representing output signals generated by said pipelined circuit element by termination of said simulated common clock signal cycle;
(iii) a second data storage area for storing said output data values; and
(iv) control logic for changing said second data storage area to serve as said first data storage area such that said stored output data values may serve as input data values during a following simulated clock signal cycle and changing to use a different storage area as said second storage area.

Viewed from a further aspect the present invention provides a computer program storage medium storing a computer program for controlling a computer to perform a method of simulating operation of data processing apparatus including a plurality of pipelined circuit elements driven by a common clock signal, said method using a plurality of pipelined circuit element models linked by one deep message queues and comprising the steps of:
(i) within a first data storage area storing input data values representing respective input signals passed to each pipelined circuit element at commencement of a simulated common clock signal cycle of said common clock signal;
(ii) during simulation of said simulated common clock signal cycle reading said input data values for each pipelined circuit element from said first data storage area and using a pipelined circuit element model for each pipelined circuit element to generate output data values representing output signals generated by said pipelined circuit element by termination of said simulated common clock signal cycle;
(iii) within a second data storage area storing said output data values; and
(iv) changing said second data storage area to serve as said first data storage area such that said stored output data values may serve as input data values during a following simulated clock signal cycle and changing to use a different storage area as said second storage area.

The above, and other objects, features and advantages of this invention will be apparent from the following detailed description of illustrative embodiments which is to be read in connection with the accompanying drawings.

DESCRIPTION OF THE PREFERRED EMBODIMENTS

Message Passing

Message passing is a known software tool, in essence one software block communicates with another via a message queue. The message may either contain data, or notification of an event, or both. This metaphor may be used to represent hardware environments. A standard language in which to describe such systems is based on the universal modelling language, and will be called X-UML, which is predominately an event passing language. Blocks of hardware are seen as objects which are triggered by an incoming event and generate events for other blocks.

X-UML is a language used to describe a system, systems described in X-UML must be compiled or interpreted in order to be simulated. The environment proposed here offers a platform on which systems, described in a language such as X-UML, which can be mapped to a software architecture with a single depth event queue (i.e. Pipelined hardware), may be simulated.

Pipelined Hardware

One view of the pipelined hardware is that logic blocks pass events to each other via latches. This is analogous to a software message or event passing system. Since latches can only hold one value at a time, the depth of the message queues is known to be one.

Typically microprocessors are highly pipelined because of the requirement for speed. Building accurate simulations of highly pipelined microprocessors is a very time consuming and difficult task. Software is inherently serial in nature, while hardware is inherently parallel. This difficulty is compounded by the requirement to accurately simulate the effects of the pipelined architecture. Each stage of the pipeline in hardware is calculating its results in parallel with every other stage. In software, the preferred solution would be to "summarise" the behaviours of the entire microprocessor and simply calculate the time taken (in terms of the number of cycles passed) to perform various operations. This leads to very fast, architecturally accurate, simulations. Such simulation are often not as accurate as required, especially if they are to be used for co-verification. Here the simulator would be expected to drive, and be driven by other hardware, simulated in a traditional event based manner. This type of simulation is absolutely timing accurate and the simulation of the microprocessor would have to match this level of accuracy.

The environment described here is intended to reduce the time taken to build an "instruction set simulator", as the simulator can be directly based on the hardware implementation, while maintaining a good simulation speed and achieving the required accuracy.

Figure 1:
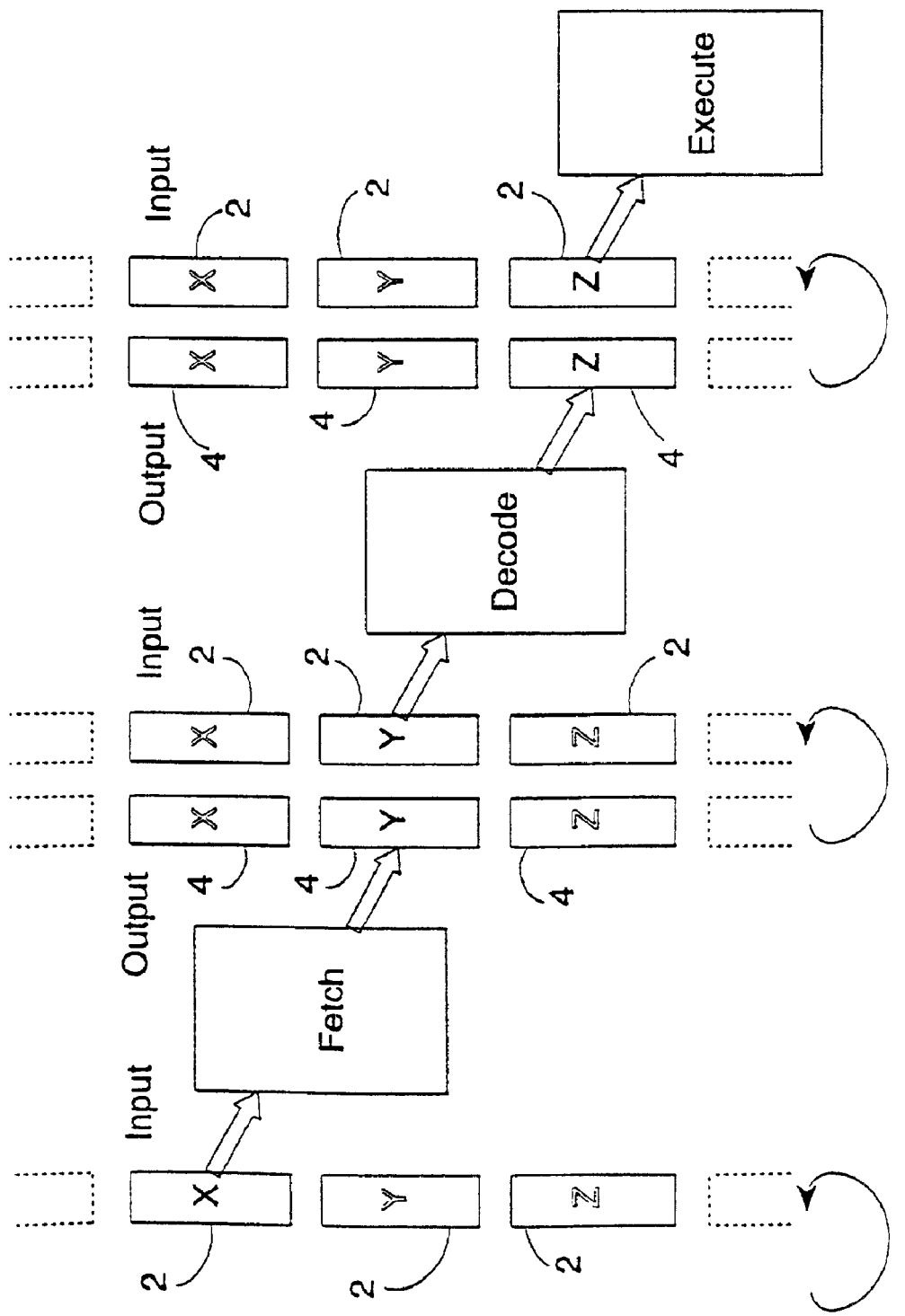
FIG. 1 schematically illustrates a plurality of pipelined circuit element models exchanging data values.

FIG. 1 shows a fetch stage and a decode stage of a typical microprocessor, (these are merely intended as example pipelined circuit element models). The fetch stage takes an input (X) and generates an output (Y). Output Y is used by the decode stage.

In each "cycle" the logic segments in the pipeline (fetch and decode in this example) execute exactly once. They read from their input registers, and write to their output registers. At the end of each cycle the output registers are copied to the corresponding input registers, so that in this case, fetch outputs an event which is used by decode as an input. In hardware this is achieved by "clocking" the latches. In software a different mechanism is required. This mechanism is a key to the environment described here. Notice that this is a simple example, and that in more complex cases a single segment may take its inputs from many sources, but except for a few exceptions (which will be examined below), they take their inputs from a "latch".

The input registers 2 as illustrated form the first data storage area A. Similarly, the output registers 4 as illustrated collectively form the second data storage area B. At the end of each simulated common clock signal cycle, pointers to the two data storage areas are swapped such that the output values of the preceding cycle become the input values for the next stage in the following cycle.

"Clocking" Software Registers

Figure 2:
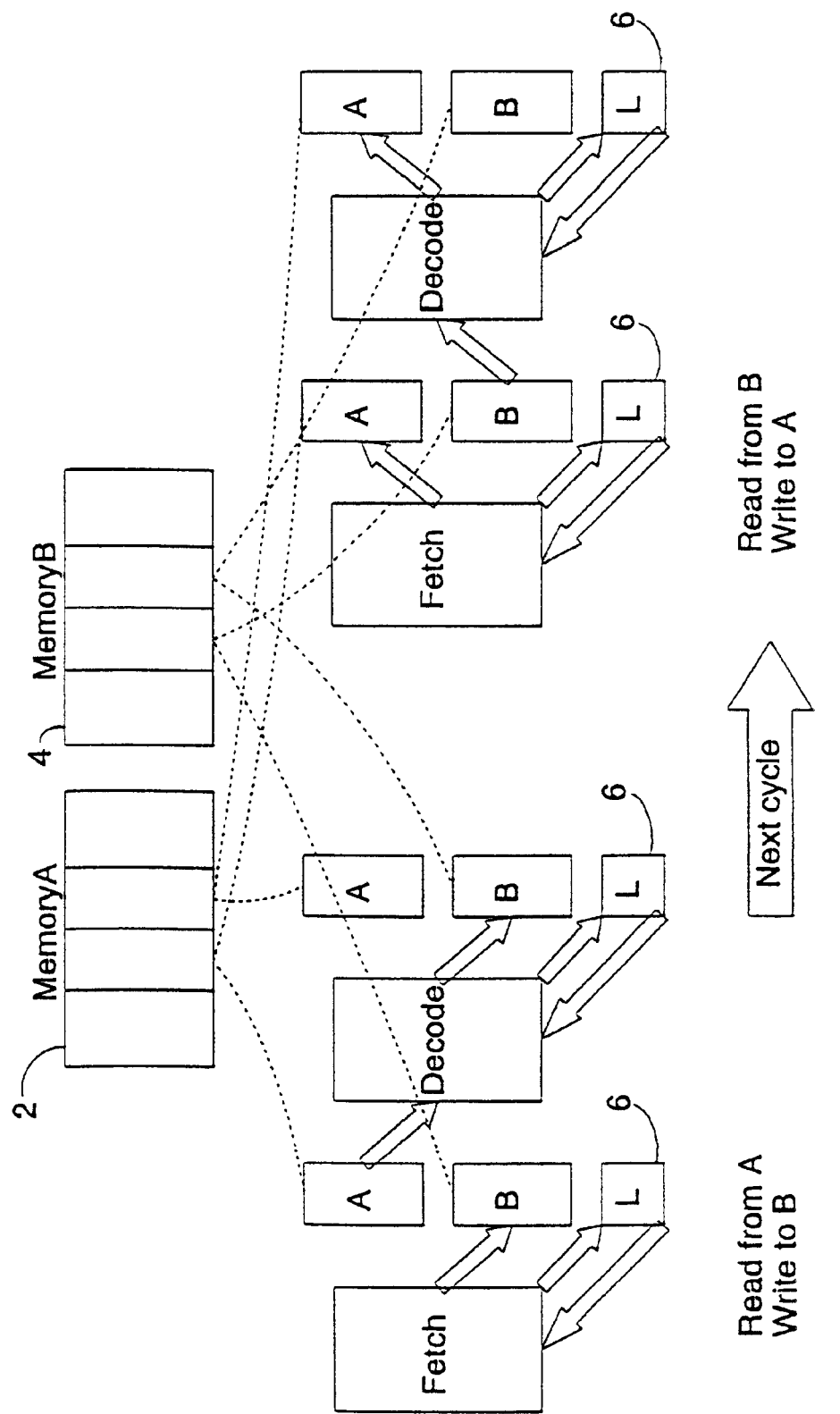
FIG. 2 shows another view of the model illustrating the way in which the memory areas for input and output data values are swapped between simulated processing cycles.

The structure from FIG. 1 can also be viewed as shown in FIG. 2 for the software architecture proposed.

Fetch outputs to one register, which must be copied to another register to be read by decode each cycle. In this case, fetch writes to a segment of data structure B, while decode reads from data structure A. Decode is itself writing to a separate portion of data structure B. To achieve the copy of the data between the "input" and "output", all that is required is that data blocks A and B are swapped for each "clock", at the end of each "cycle".

Hence, a simple piece of code that performs this may read
fetch (A, B)
decode (A, B)
fetch (B, A)
decode (B, A)

The "clock switch" has now been performed with no software overhead. Compile time scheduling may be used to fix the order of execution of the functional blocks such that few function calls are needed at runtime and faster operation may be achieved. Functional blocks can be written just as logical blocks in the hardware (though of course the complexity of writing this logic in software is considerably less than in hardware). This will reduce the difficulty of writing the software models, especially in making them accurate.

The diagram also shows decode writing to a "state" variable storage area L. These variables do not need to be "copied" as they are only used as local state in the logic of one stage. However to keep the structure well defined, they are explicitly identified. The optimisation of not copying the local variables like all other events can be made as long as the assumption that the logic blocks will only be called once per cycle holds.

It should be noted that while the emphasis here is on pipelined hardware and single depth message queues, the technique can be extended to any fixed length message queue, which can be modelled as multiple single depth message queues.

In pipelined hardware it is common to have signals which pass through more than one latch before they are used. In a single depth messaging system, this effect can be realised by explicitly connecting the events up between two independent queues. This is a simple case, but there are more complex hardware constructs which must also be considered.

Multistage Combinatorial Logic

Figure 3:
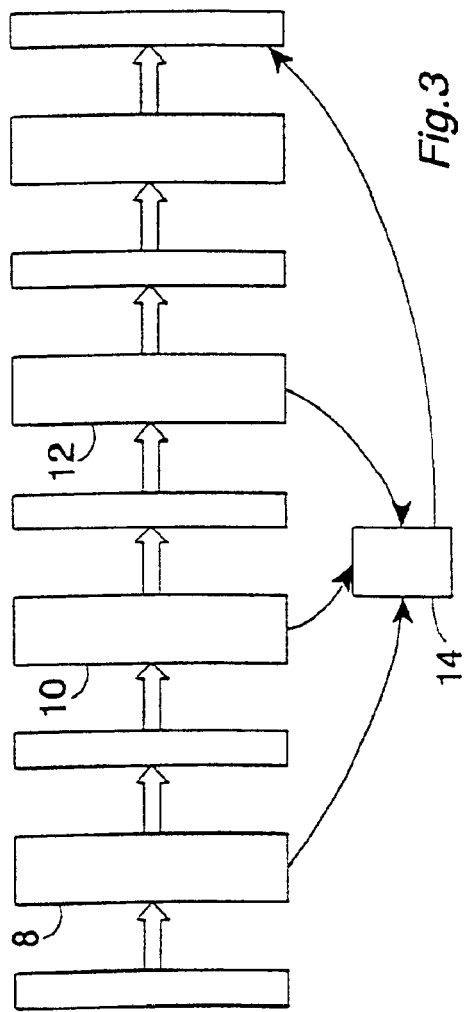
FIGS. 3 and 4 illustrate two ways in which non-pipelined circuit element models may be incorporated within the simulation as a whole.

It is common in pipelined hardware to have blocks of logic which take input from many "pipeline stages". Clearly if these signals come from "latches", (within a single depth messaging system, directly from a message queue) this is no problem, as has been mentioned above. However, sometimes these are logical combinations in their own right. FIG. 3 represents an example in which a piece of combinatorial logic takes inputs from three pipeline stages 8, 10, 12. The "latches" between the stages are represented as thin lines, with the combinatorial logic represented as larger blocks. The "latches" will be clocked once per cycle, allowing the outputs from the previous stage to become the input to the next stage. The figure is diagrammatic only, in a real design, signals would be combined from many stages. These results may, or may not, be destined for a latch in their own right, but they must be combined during the same cycle, and so can not pass through a latch. This may be a critical path in the hardware, e.g. the assumption in RISC processors is that all these signals will be calculated and combined within a single cycle.

Within a single depth message passing system there are two possible ways of implementing such an example. The first is to replicate the logic required for the multistage combinatorial block 14 such that it takes its inputs directly from the message queue. This is the simple solution shown in FIG. 3, but this is most appropriate when the required replicated logic is simple. A more general solution is diagrammatically represented in FIG. 4.

Figure 4:
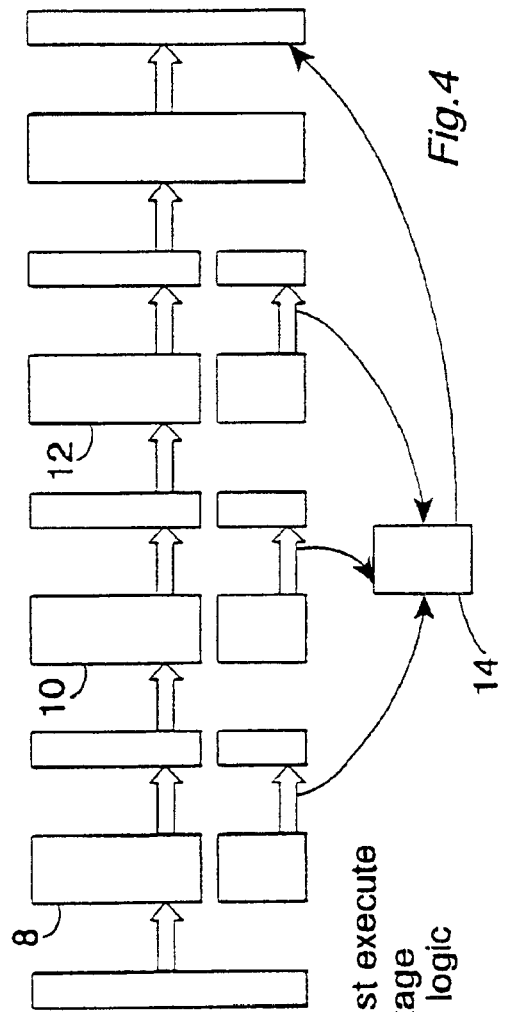

In essence what is happening in FIG. 4 is that a "sub domain clock" is being used. The pipeline stages 8, 10, 12 are expected to complete their calculations before the first set of latches are clocked, then the combinatorial logic 14 must complete its calculations for the final latch.

A separate queue in its own right is not needed for each signal in this case, as the output from the stages can be read by the combinatorial logic as its input from the "input" side of the latches, this is essentially what the hardware would be doing. The only difference is that there must exist a place in the message queues such that the data can be placed in it and read from it. However, there is of course one very important stipulation, and that is that the combinatorial logic should be executed after the pipeline stages that generate its inputs. This is the mechanism by which the "sub domain clock" is realised.

This leads on to a slightly more complex, but related problem of multiple clock domains.

Multiple Clock Domains

In some pipelined hardware, there can be more than one clock domain. In this case, there are essentially two parallel pipelines 16, 18 executing at different speeds. The easiest way of dealing with this is have two completely independent message systems. One can be "clocked" more often than the other. In itself this is a perfectly satisfactory solution. However, there are problems with multiple clock domains that must be handled in hardware, and give rise to similar problems in software.

Non-deterministic behaviour in the hardware will not be simulated in the same way. Under simulation non-deterministic behaviour will become completely deterministic. This may be a problem under some circumstances. However, for most microprocessors it is not a problem as non-deterministic behaviour is not tolerated in such designs.

Figure 5:
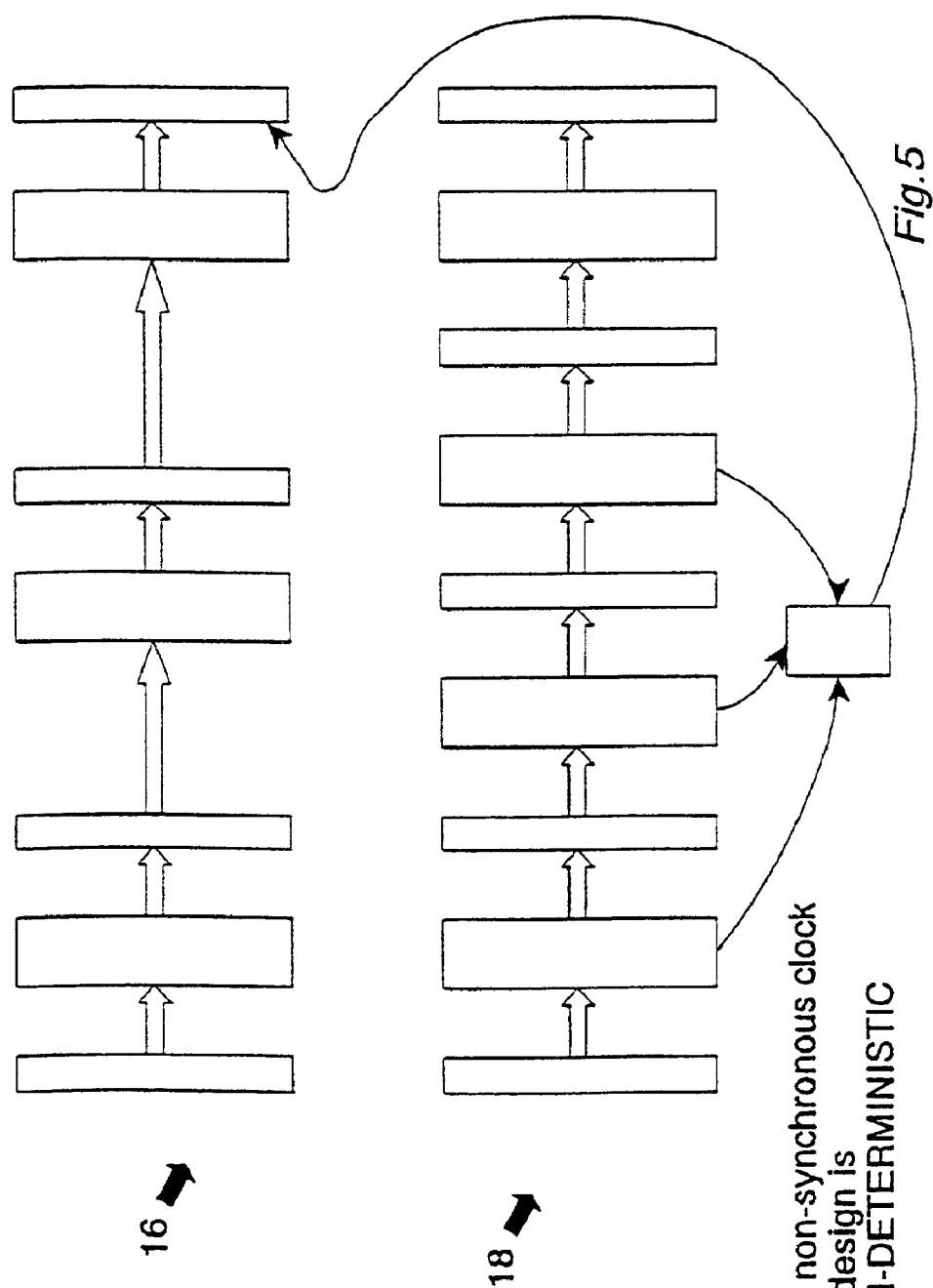
FIG. 5 illustrates the simulation of a system including multiple clock domains.

FIG. 5 shows a possible example of a system which may have non-deterministic results. This a combination of multistage combinatorial logic with multiple clock domains. Since the exact internal timings of the multistage combinatorial logic is not calculated the value of the signals being passed between the two different pipelines will not necessarily reflect the hardware under similar conditions.

It should be re-emphasised that such hardware constructs are not tolerated in normal designs. In general the signals which move between the different pipelines would come directly from latches in each pipeline. This of course would work in exactly the same way under simulation as it would in real hardware.

Figure 6:
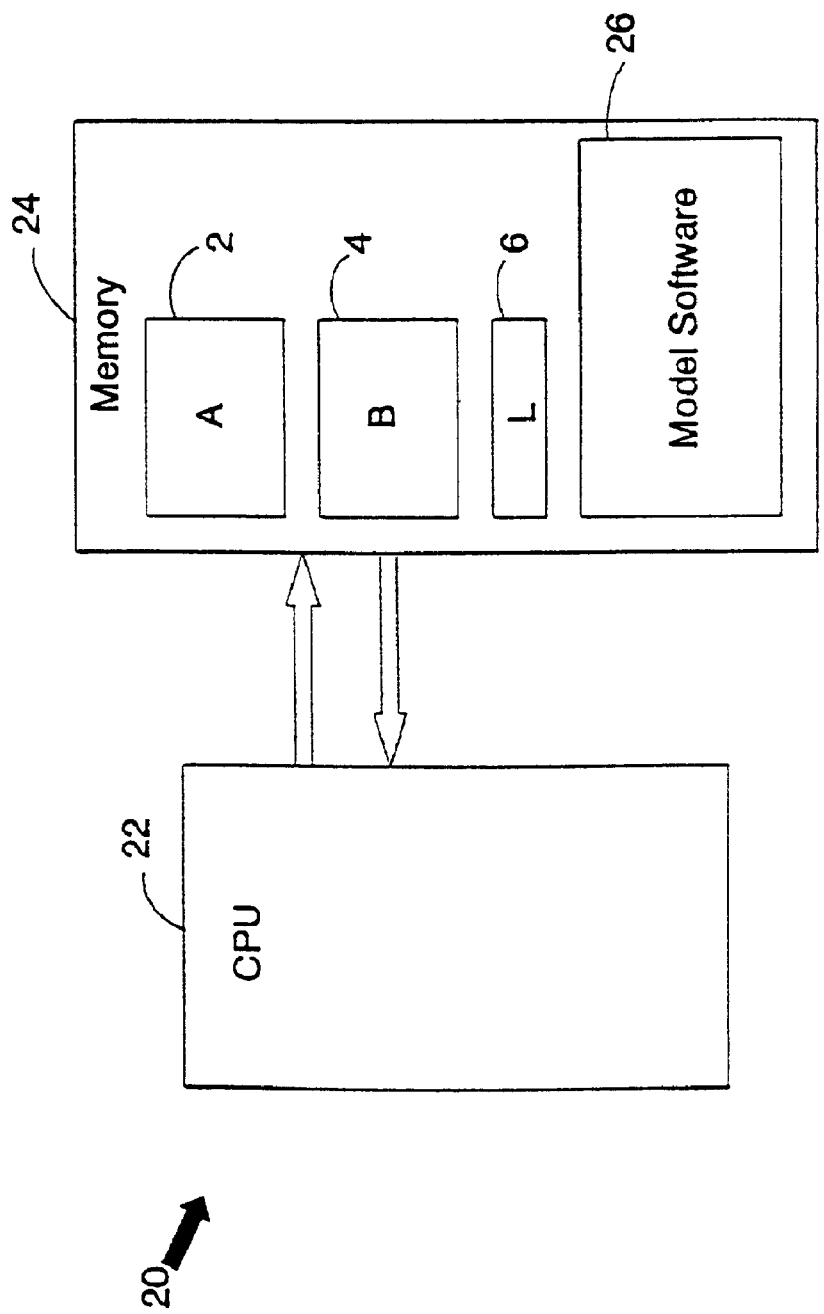
FIG. 6 illustrates highly schematically a general purpose computer upon which the software simulation of the present technique may be performed.

FIG. 6 highly schematically illustrates a general purpose computer 20 used to execute the software simulation technique described above. The general purpose computer 20 includes a central processing unit 22 and a common memory 24. The first data storage area 2 and the second data storage area 4 are respective regions within the common memory 24. The local variable storage 6 is also provided within the common memory 24. The software models of the pipelined circuit elements 26 are also stored within the common memory 24 together with the overall controlling software for the simulation system as a whole. The swapping of the pointers to the memory areas 2, 4 can effectively be achieved by swapping memory address offset values or similar techniques.

Figure 7:
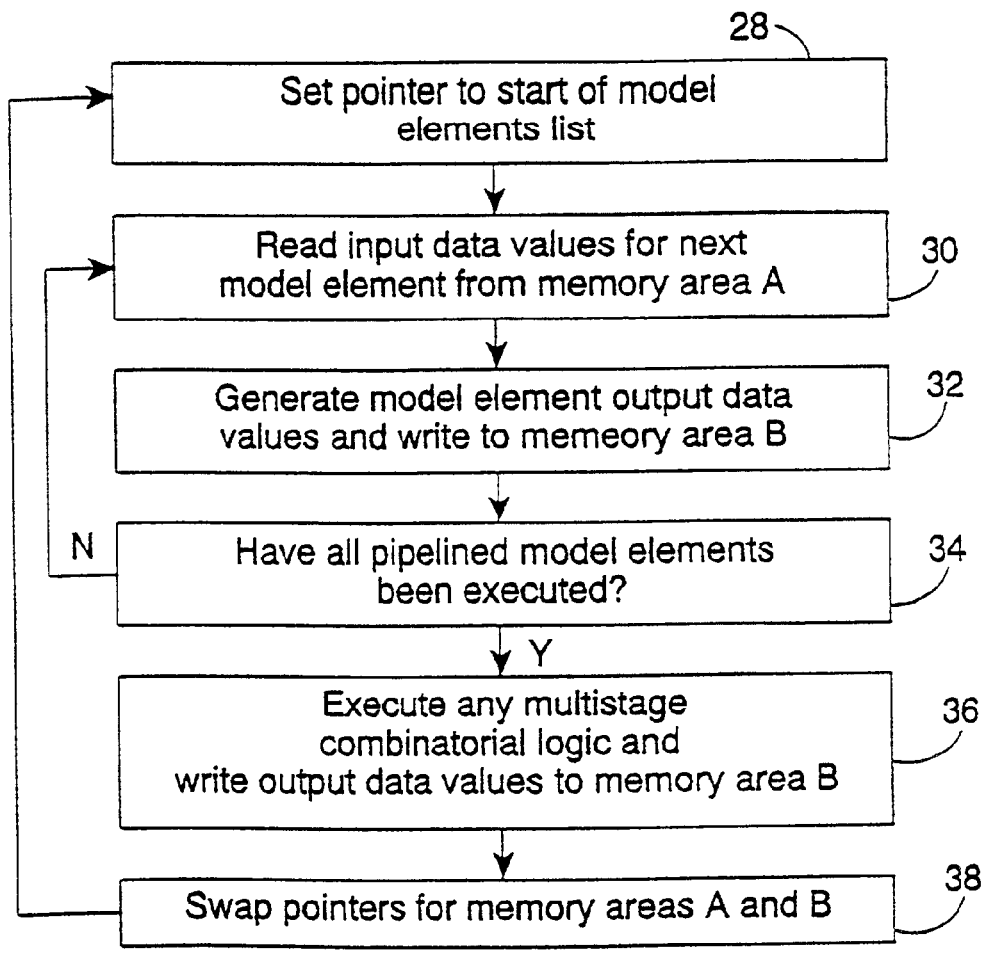
FIG. 7 is a flow diagram illustrating the modelling technique.

FIG. 7 is a flow diagram illustrating the high level operation of the simulation technique. At step 28 the system sets a pointer to point to the beginning of the list of model elements that each represent pipeline circuit elements. At step 30 the inputs for the first model are read from the memory area A. At step 32 the outputs from the first model are generated and written to the memory area B. At step 34 a check is made as to whether all of the pipelined model elements have been executed. If all of the pipelined model elements have not been executed, then a return is made to step 30 where the next pipelined model element is executed. Compile time scheduling may be used to effectively compress steps 28, 30, 32 and 34 into a single functional block so as to reduce the number of runtime calls and so speed up operation. If all of the pipelined model elements had been executed, then step 36 is reached at which any multi-stage combinatorial logic is executed and its output data values written to the memory area B. At step 38 the pointers for the memory areas A and B are swapped such that the outputs from one stage become the inputs to the next stage and the inputs from the preceding cycle may be overwritten with newly generated output data values. A return is then made to step 28 such that the next simulated clock signal cycle can be processed.

SUMMARY

A software technique based on a single depth messaging system has been described. It has been shown how this system can be used to simulate pipelined hardware, which has the feature that it can be represented as a system with single depth messages being passed between its sub-blocks (the pipeline stages). Some of the advantages of using such a system have been explored. Notably, it allows the designer of the simulator to construct their simulation with close reference to the (intended) hardware design. Furthermore the results of such simulations may be constructed to be highly accurate in terms of how the hardware (will) behave.

Some potentially difficult hardware constructs have been examined to show how they can be represented, and one potential problem (which should not occur in microprocessor design) has been identified (namely non-deterministic behaviour will be different under simulation).

A system based on this methodology has been constructed, with good results. A simple design, consisting of a three stage pipelined microprocessor with a small instruction set and some memory, running on a Pentium II at 450 Mhz achieves about 7.5 million cycles per second (Pentium is a registered trade mark of Intel Corporation). Based on this, the expectation is that a full design of a more complex microprocessor and surrounding memory and peripheral system would be expected to achieve above one MIP.

Figure 8:
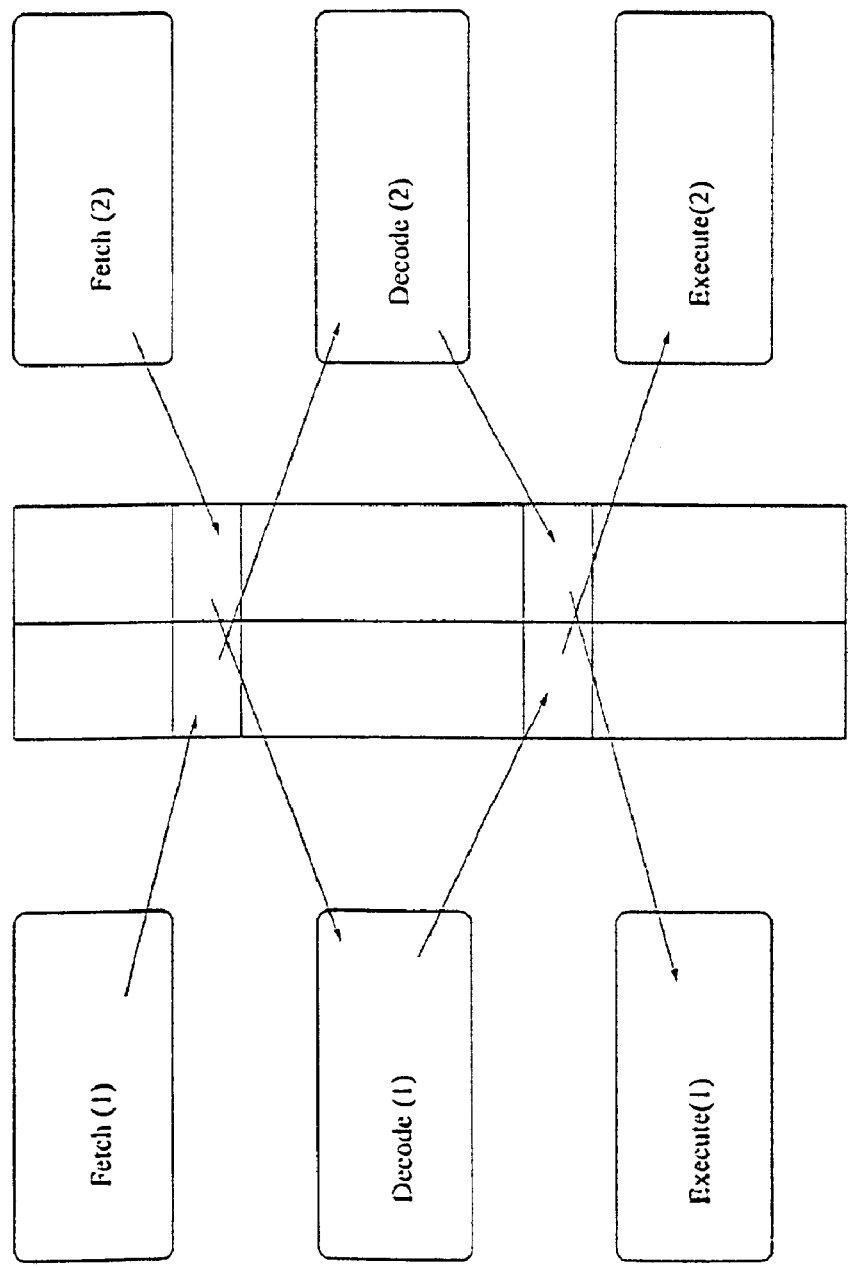
FIG. 8 illustrates a system in which two functions access a common storage area.

FIG. 8 illustrates an alternative embodiment. Whilst the basic mechanism uses two data storage areas and code that first accesses one and then the other, an alternative is to have two separate pieces of code, one compiled to access a first area and the other compiled to access the second area. In this way, rather than swapping a pointer, it is possible to simply execute the code fragments in turn. The approach allows the compiler to make better optimisations and achieve faster simulation.

Figure 9:
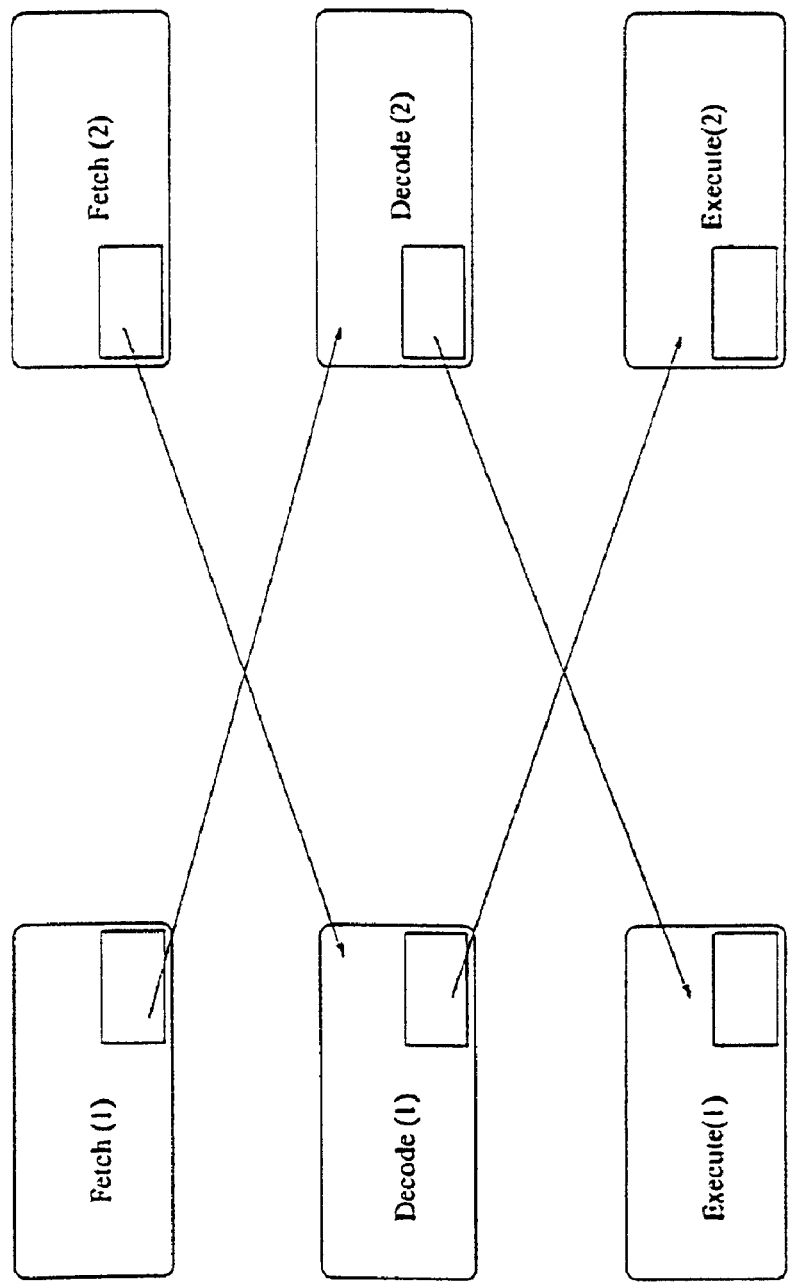
FIG. 9 illustrates a modification of the system of FIG. 8 in which the storage area has been divided up and made "local" to the code portions.

FIG. 9 illustrates a progression from the arrangement of FIG. 8. In the FIG. 9 embodiment, the data storage areas are moved such that they are considered local to the code excepts. Whilst this is equivalent to the FIG. 8 embodiment, there are subtle and useful differences. Firstly, the memory allocation for local data can be carried out by the individual code blocks, which means the entire system need not be "flatterened" to determine the storage blocks, as was the case in the FIG. 8 embodiment. In turn, this means that the FIG. 9 embodiment can be constructed dynamically.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of simulating operation of data processing apparatus including a plurality of pipelined circuit elements driven by a common clock signal, said method using a plurality of pipelined circuit element models linked by one deep message queues and a set of data storage areas and comprising the steps of:
   (i) within a first data storage area storing input data values representing respective input signals passed to each pipelined circuit element at commencement of a simulated common clock signal cycle of said common clock signal;
   (ii) during simulation of said simulated common clock signal cycle reading said input data values for each pipelined circuit element from said first data storage area and using a pipelined circuit element model for each pipelined circuit element to generate output data values representing output signals generated by said pipelined circuit element by termination of said simulated common clock signal cycle;
   (iii) within a second data storage area storing said output data values; and
   (iv) changing said second data storage area to serve as said first data storage area such that said stored output data values may serve as input data values during a following simulated clock signal cycle and changing to use a different storage area as said second storage area.

2. A method as claimed in claim 1, wherein said first data storage area and said second data storage area swap roles such that newly generated output data values may overwrite input data values for a preceding simulated common clock signal cycle.

3. A method as claimed in claim 1, wherein at least some of said input data values and said output data values represent signal values passed via latches between adjacent serially arranged pipelined circuit elements.

4. A method as claimed in claim 1, wherein at least some of said output data values represent signal values received from non-pipelined circuit elements.

5. A method as claimed in claim 4, wherein at least some of said input data values represent signal values passed to said non-pipelined circuit elements.

6. A method as claimed in claim 5, wherein any output data values from a non-pipelined circuit element model are generated after generation of and using any output data values produced elsewhere that serve as input data values to said non-pipelined circuit element model.

7. A method as claimed in claim 4, wherein at least one of said non-pipelined circuit elements is passed non-latched input data values directly from one or more of said pipelined circuit element models.

8. A method as claimed in claim 1, wherein said pipeline circuit element models are software models that map input data values to output data values.

9. A method as claimed in claim 1, wherein said data processing apparatus includes multiple clock domains, each clock domain being associated with a separate plurality of pipe lined circuit elements, clocking of each plurality of pipelined circuit elements being separately simulated.

10. A method as claimed in claim 1, wherein said data processing apparatus includes a pipelined processor.

11. A method as claimed in claim 10, wherein each processor pipeline stage corresponds to a pipelined circuit element model.

12. A method as claimed in claim 1, wherein said first data storage area corresponds to a first address region within a common memory.

13. A method as claimed in claim 12, wherein said second data storage area corresponds to a second address region within said common memory.

14. A method as claimed in claim 1, wherein said plurality of pipelined circuit element model are subject to compile time scheduling to form a single functional block.

15. Apparatus for simulating operation of data processing apparatus including a plurality of pipelined circuit elements driven by a common clock signal, said apparatus using a plurality of pipelined circuit element models linked by one deep message queues and comprising:
   (i) a first data storage area for storing input data values representing respective input signals passed to each pipelined circuit element at commencement of a simulated common clock signal cycle of said common clock signal;
   (ii) a pipelined circuit element model for each pipelined circuit element operating during simulation of said simulated common clock signal cycle to read said input data values for each pipelined circuit element from said first data storage area and to use said input data values to generate output data values representing output signals generated by said pipelined circuit element by termination of said simulated common clock signal cycle;
   (iii) a second data storage area for storing said output data values; and
   (iv) control logic for changing said second data storage area to serve as said first data storage area such that said stored output data values may serve as input data values during a following simulated clock signal cycle and changing to use a different storage area as said second storage area.

16. A computer program storage medium storing a computer program for controlling a computer to perform a method of simulating operation of data processing apparatus including a plurality of pipelined circuit elements driven by a common clock signal, said method using a plurality of pipelined circuit element models linked by one deep message queues and comprising the steps of:
   (i) within a first data storage area storing input data values representing respective input signals passed to each pipelined circuit element at commencement of a simulated common clock signal cycle of said common clock signal;
   (ii) during simulation of said simulated common clock signal cycle reading said input data values for each pipelined circuit element from said first data storage area and using a pipelined circuit element model for each pipelined circuit element to generate output data values representing output signals generated by said pipelined circuit element by termination of said simulated common clock signal cycle;
   (iii) within a second data storage area storing said output data values; and
   (iv) changing said second data storage area to serve as said first data storage area such that said stored output data values may serve as input data values during a following simulated clock signal cycle and changing to use a different storage area as said second storage area.

* * * * *